United States Patent

Hatano et al.

Patent Number: 6,057,570
Date of Patent: May 2, 2000

[54] SOLID-STATE IMAGE DEVICE

[75] Inventors: Keisuke Hatano; Yasutaka Nakashiba, both of Tokyo, Japan

[73] Assignee: NEC Corporation, Tokyo, Japan

[21] Appl. No.: 09/272,574

[22] Filed: Mar. 19, 1999

[30] Foreign Application Priority Data

Mar. 30, 1998 [JP] Japan .................................. 10-084112

[51] Int. Cl.[7] ........................ H01L 31/062; H01L 31/113; H01L 29/788
[52] U.S. Cl. .......................... 257/294; 257/316; 257/324; 257/326; 257/435
[58] Field of Search .................... 257/324, 326, 257/294, 435, 315, 316

[56] References Cited

U.S. PATENT DOCUMENTS 5,773,859  6/1998  Ueno ........................................ 257/294
5,815,433  9/1998  Takeuchi ................................. 365/182

FOREIGN PATENT DOCUMENTS 62-160882  7/1987  Japan .
5-316439  11/1993  Japan .

*Primary Examiner*—Ngân V. Ngô
*Attorney, Agent, or Firm*—Young & Thompson

[57] ABSTRACT

A solid-state image device includes a peripheral having a non-volatile memory transistor 4, which is a transistor of the MNOS type, MONOS type or floating gate type, with a structure in which charge is trapped in insulation means below the gate electrode for varying the threshold voltage, wherein said non-volatile memory transistor is arranged outside image circle 3 on solid-state image device 1 so that light is not incident on the solid-state image device during use.

4 Claims, 2 Drawing Sheets

SOLID-STATE IMAGE DEVICE

BACKGROUND OF THE INVENTION

1. Field of the Invention

This invention relates to an arrangement of a peripheral circuit of a solid-state image device, and more particularly to a solid-state image device which includes a peripheral circuit having a non-volatile memory transistor, such as a transistor of the MNOS type, MONOS type or floating gate type, with a structure in which charge is trapped in insulation means below the gate electrode for varying the threshold voltage.

2. Description of the Related Art

An arrangement of a peripheral circuit in a conventional solid-state image device is described.

FIG. 1 shows a plan view of a conventional solid-state image device which includes a peripheral circuit having a non-volatile memory transistor such as a transistor of the MNOS type, MONOS type or floating gate type.

One of peripheral circuits of a solid-state image device having a transistor having such a structure as just described is a circuit which generates a voltage to be applied to a substrate. This circuit is called a substrate voltage generator. Normally, the substrate voltage is set to a voltage for controlling blooming of signal charge in a photo-electric transducer of a solid-state image element. The voltage value is different among different image devices, and it is required for the camera side to set the voltage for each image device. The substrate voltage generator converts a fixed voltage to be applied from the outside to a preset value for controlling blooming and stores charge in the non-volatile memory transistor arranged in a resistor divider to vary the threshold voltage in order to generate a desired voltage. An operation for trapping charge into such non-volatile memory transistors is performed in a testing step of the image device.

In the conventional solid-state image device described above, the non-volatile memory transistors of the peripheral circuits are arranged at suitable places inside an image circle to achieve overall compactness.

When a solid-state image device is applied to a camera, a circular image-formation plane (hereinafter referred to as image circle) 23, as shown in FIG. 1 is formed by an image lens. This image circle 23 is formed to cover the entire of image area (hereinafter referred to as image area) 22 of chip (solid-state image element) 21.

In the conventional example, although non-volatile memory transistor 24 of a peripheral circuit is not included in image area 22, it is included within image circle 23.

Therefore, if light strikes non-volatile memory transistor 24 in the circular image circle through the lens during use of the camera for a long period of time, then charge stored in insulation means below the gate electrode of non-volatile memory transistor 24 acquires energy. If this energy increases beyond the trapping energy level, then the charge is discharged from the trapping level. This gradually varies the threshold voltage of non-volatile memory transistor 24 and gives rise to a problem that a characteristic of the peripheral circuit is varied.

SUMMARY OF THE INVENTION

It is an object of the present invention to provide a solid-state image device having a high degree of reliability wherein, said solid-state image device has a peripheral circuit having a non-volatile memory transistor, such as a transistor of the MNOS type, MONOS type or floating gate type, with a structure in which charge is trapped in insulation means below the gate electrode for varying the threshold voltage, wherein the non-volatile memory transistor is arranged outside an image circle on the solid-state image device such that light may not strike the non-volatile memory transistor during use of the image device so as to prevent variation of the threshold voltage of the non-volatile memory transistor, thereby to stabilize a characteristic of the peripheral circuit.

In order to attain the object described above, according to the present invention, a solid-state image device which includes a peripheral circuit having a non-volatile memory transistor, such as a transistor of the MNOS type, MONOS type or floating gate type, with a structure in which charge is trapped in insulation means below a gate electrode for varying a threshold voltage is characterized in that the non-volatile memory transistor is arranged outside an image circle on the solid-state image device.

Since the non-volatile memory transistor is arranged outside the image cycle so that light may not strike the non-volatile memory transistor during use of the solid-state image device, the solid-state image device of the present invention is advantageous in that variation of the threshold voltage can be prevented, thereby to augment the reliability of the non-volatile memory transistor.

The above and other objects, features, and advantages of the present invention will become apparent from the following description based on the accompanying drawings which illustrate examples of the present invention.

DETAILED DESCRIPTION OF THE PREFERRED EMBODIMENT

An embodiment of the present invention is described with reference to the drawings.

Figure 1:
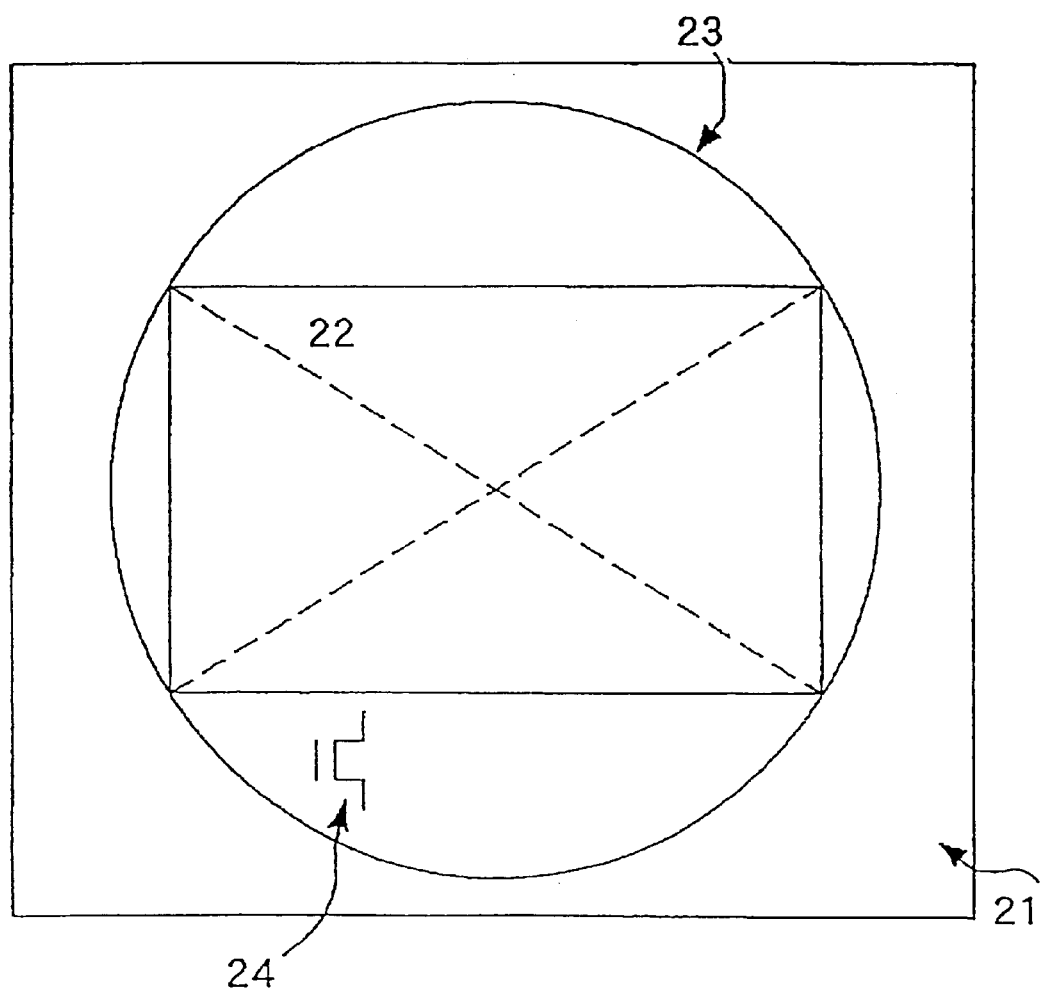
FIG. 1 is a plan view of a conventional solid-state image device.
Figure 2:
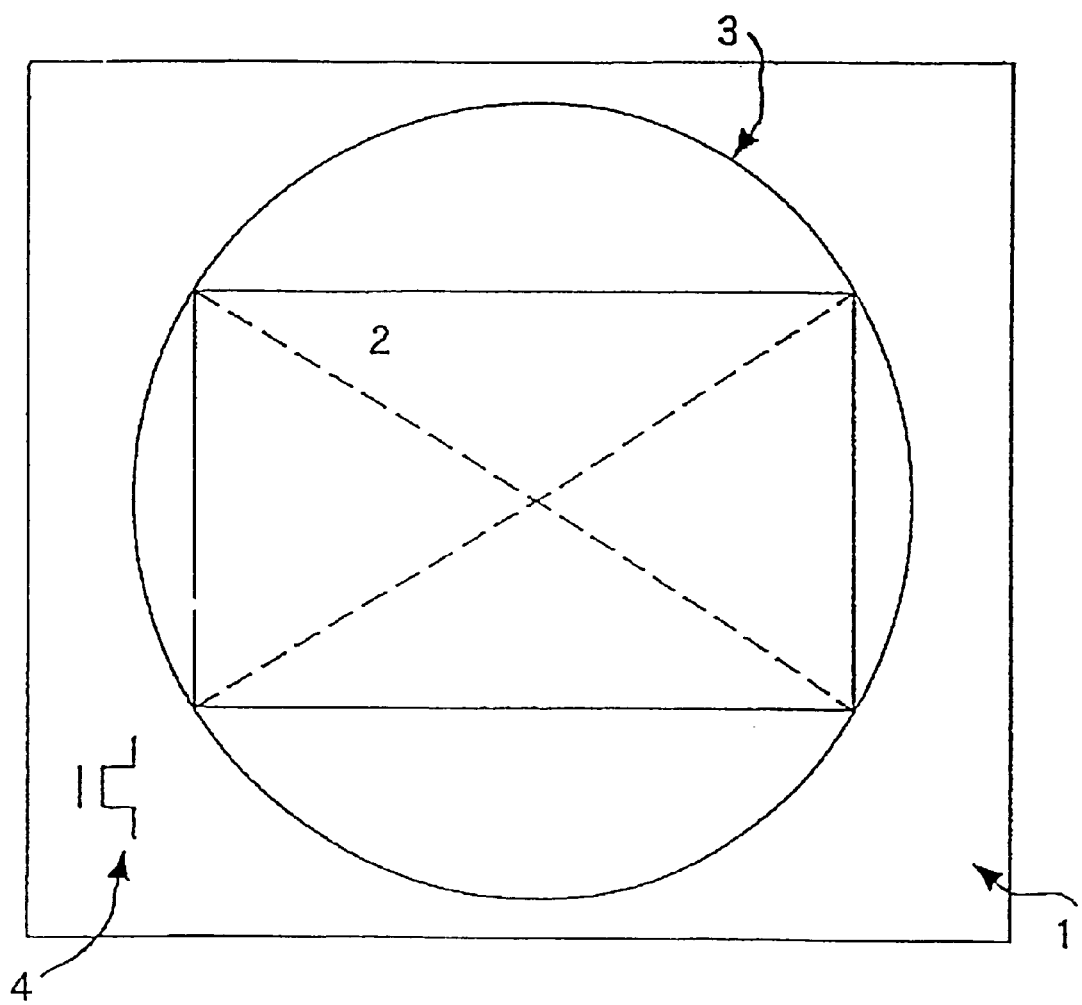
FIG. 2 is a plan view of a solid-state image device of an embodiment of the present invention.

FIG. 2 is a plan view of a solid-state image device of an embodiment of the present invention.

As shown in FIG. 2, in the embodiment of the present invention, non-volatile memory transistor 4 of a peripheral circuit is arranged outside an image circle 3 on chip 1.

When the solid-state image device is applied to a camera, non-volatile memory transistor 4 which is a transistor of the MNOS (Metal-Nitride Oxide Semiconductor) type, MONOS (Metal-Oxide Nitride Oxide Semiconductor) type or floating gate type, included in the peripheral circuit and having a structure wherein charge is trapped in insulation means below the gate electrode to vary the threshold voltage is arranged outside an image circle 3 provided by the image lens on chip (solid-state image element) 1. Image circle 3 is formed such that it covers the entire image area 2 of solid-state image device 1.

Due to the arrangement described above, when the image device is used, light is not incident on non-volatile memory transistor 4 of the peripheral circuit. Consequently, charge trapped in the insulation means below the gate electrode does not acquire energy, and no charge is discharged from the trapping level. As a result, a stabilized circuit characteristic free from a variation of the threshold voltage is obtained.

While a preferred embodiment of the present invention has been described using specific terms, such description is for illustrative purposes only, and it is to be understood that changes and variations may be made without departing from the spirit or scope of the following claims.

What is claimed is:

1. A solid-state image device which includes a peripheral circuit having a non-volatile memory transistor with a structure in which charge is trapped in insulation means below a gate electrode for varying a threshold voltage, wherein said transistor is arranged at a position at which light is not incident on said transistor.

2. A solid-state image device which includes a peripheral circuit having a non-volatile memory transistor, such as a transistor of the MNOS type, MONOS type or floating gate type, with a structure in which charge is trapped in insulation means below a gate electrode for varying a threshold voltage, wherein said transistor is arranged outside an image-formation plane (image circle) on said solid-state image device.

3. A solid-state image device as set forth in claim 2, wherein said peripheral circuit is a substrate voltage generator for generating a voltage to be applied to a substrate.

4. A solid-state image device as set forth in claim 3, wherein said substrate voltage generator sets a threshold voltage for controlling blooming.

\* \* \* \* \*